United States Patent
Zheng et al.

(10) Patent No.: US 11,031,445 B2
(45) Date of Patent: Jun. 8, 2021

(54) ARRAY SUBSTRATE AND DISPLAY DEVICE WITH BACKSIDE CAMERA

(71) Applicant: WUHAN CHINA STAR OPTOELECTRONICS SEMICONDUCTOR DISPLAY TECHNOLOGY CO., LTD., Hubei (CN)

(72) Inventors: Min Zheng, Wuhan (CN); Yang Zhou, Wuhan (CN); Qi Ouyang, Wuhan (CN); Hong Gao, Wuhan (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 9 days.

(21) Appl. No.: 16/629,568

(22) PCT Filed: Sep. 25, 2019

(86) PCT No.: PCT/CN2019/107652
§ 371 (c)(1),
(2) Date: Jan. 9, 2020

(87) PCT Pub. No.: WO2020/232938
PCT Pub. Date: Nov. 26, 2020

(65) Prior Publication Data
US 2021/0083023 A1 Mar. 18, 2021

(30) Foreign Application Priority Data
May 23, 2019 (CN) .......... 201910434553.0

(51) Int. Cl.
*H01L 27/32* (2006.01)
*H01L 51/52* (2006.01)

(52) U.S. Cl.
CPC ...... *H01L 27/3246* (2013.01); *H01L 27/3234* (2013.01); *H01L 27/3276* (2013.01); *H01L 51/5253* (2013.01)

(58) Field of Classification Search
CPC ............. H01L 27/3246; H01L 27/3234; H01L 27/3276; H01L 27/5253; H01L 51/5253
See application file for complete search history.

(56) References Cited

U.S. PATENT DOCUMENTS

| | | | |
|---|---|---|---|
| 2017/0148856 A1* | 5/2017 | Choi | H01L 51/0096 |
| 2017/0162637 A1* | 6/2017 | Choi | G09G 3/3225 |
| 2017/0235398 A1* | 8/2017 | Choi | H04M 1/0266 345/173 |
| 2019/0246018 A1* | 8/2019 | Rho | H04N 5/2254 |
| 2019/0384121 A1* | 12/2019 | Nishiwaki | G02F 1/133512 |
| 2020/0014780 A1* | 1/2020 | Jones | H04N 5/2252 |

* cited by examiner

Primary Examiner — Lex H Malsawma

(57) ABSTRACT

The present application provides an array substrate and a display device, including a thin film transistor layer, a planarization layer and a pixel definition layer prepared on a base substrate in turn. The base substrate disposes a camera area in a display area, and the camera area includes a first blinding hole and a wiring area. The first blind hole is used to expose a camera disposed on a back of the base substrate, and the wiring area disposes signal lines and second blind holes. The second blind holes are arranged to avoid the signal lines.

16 Claims, 2 Drawing Sheets

ARRAY SUBSTRATE AND DISPLAY DEVICE WITH BACKSIDE CAMERA

BACKGROUND OF THE INVENTION

1. Field of the Invention

The present application relates to a field of display technology, and more particularly to an array substrate and a display device.

2. Description of the Prior Art

An OLED (Organic Light-Emitting Diode) display device has been listed as the next generation display technology with great development prospects due to its advantages of thin, light, wide viewing angle, active luminescence, continuous adjustable luminous color, low cost, fast response, low energy consumption, low driving voltage, wide operating temperature range, simple production process, high luminous efficiency and flexible display.

How to increase the proportion of screens to achieve a full screen has become a hot spot at present. In the prior art, a camera module is usually placed under the screen, and the camera is exposed in an opening of a display area, so as to increase the proportion of the screen. However, because a black line area on the edge of the opening can not be eliminated, it still restricts the increase of screen proportion.

Hence, the defects existed in the prior art urgently need improvement.

BRIEF SUMMARY OF THE INVENTION

The present application provides an array substrate and a display device, which can solve the problem that the opening of the camera area of the existing display device with an under-screen camera is large and further affects the screen proportion.

In order to solve the above problems, the technical scheme provided in the present application is as follows:

The application provides an array substrate, comprising a base substrate, a thin film transistor layer, a planarization layer and a pixel definition layer prepared on the base substrate in turn. The pixel definition layer is used to define pixel opening areas;

The base substrate disposes a camera area in a display area, and the camera area includes a first blinding hole and a wiring area around the first blind hole.

The first blind hole is used to expose a camera disposed on a back of the base substrate, and the wiring area disposes signal lines and second blind holes.

Wherein, the second blind holes are arranged to avoid the signal lines for increasing a light transmittance of the wiring area.

In the array substrate provided by the application, each second blind hole is correspondingly disposed between two adjacent pixel opening areas, and the second blind holes are arranged in grid-shaped or arranged at intervals.

In the array substrate provided by the application, each second blind hole passes through or partially passes through one or more of the pixel definition layer, the planarization layer and the thin film transistor layer.

In the array substrate provided by the application, the thin film transistor layer includes inorganic film layers arranged in layers and thin film transistors arranged at intervals; and each second blind hole is corresponding to a position between two adjacent thin film transistors.

In the array substrate provided by the application, the second blind hole, the signal line and the thin film transistor are separated by the inorganic film layers and/or organic film layers.

In the array substrate provided by the application, the base substrate disposes grooves corresponding to the wiring area on the back of the base substrate away from the pixel definition layer; and a thickness of the base substrate corresponding to the grooves is less than that of other positions of the base substrate.

In the array substrate provided by the application, the grooves are corresponding to the second blind holes and are arranged along the second blind holes.

In order to solve the above problems, the application further provides a display device comprising the above array substrate. The display device further comprises:

an organic light emitting layer, being disposed on the array substrate and corresponding to the pixel opening area;

a film packaging layer, being prepared on the organic light emitting layer;

a camera, being disposed on a back of the array substrate away from the organic light emitting layer and corresponding to the camera area;

wherein, the first blind hole of the camera area is used to expose the camera; the second blind holes of the wiring area are filled with transparent material for increasing a light transmittance of the wiring area.

In the display device provided by the application, the film packaging layer at least includes a first inorganic packaging layer, an organic packaging layer and a second inorganic packaging layer, which are arranged in layers; the second blind holes are filled with the first inorganic packaging layer.

In order to solve the above problems, the application further provides an array substrate, comprising a base substrate, a thin film transistor layer, a planarization layer and a pixel definition layer prepared on the base substrate in turn. The pixel definition layer is used to define pixel opening areas.

The base substrate disposes a camera area in a display area, and the camera area includes a first blinding hole and a wiring area around the first blind hole.

The first blind hole is used to expose a camera disposed on a back of the base substrate, and the wiring area disposes signal lines and second blind holes.

Wherein the second blind holes are arranged to avoid the signal lines and are filled with transparent material for increasing a light transmittance of the wiring area.

In the array substrate provided by the application, each second blind hole is correspondingly disposed between two adjacent pixel opening areas, and the second blind holes are arranged in grid-shaped or arranged at intervals.

In the array substrate provided by the application, each second blind hole passes through or partially passes through one or more of the pixel definition layer, the planarization layer and the thin film transistor layer.

In the array substrate provided by the application, the thin film transistor layer includes inorganic film layers arranged in layers and thin film transistors arranged at intervals; and each second blind hole is corresponding to a position between two adjacent thin film transistors.

In the array substrate provided by the application, the second blind hole, the signal line and the thin film transistor are separated by the inorganic film layers and/or organic film layers.

In the array substrate provided by the application, the base substrate disposes grooves corresponding to the wiring area on the back of the base substrate away from the pixel definition layer; and a thickness of the base substrate corresponding to the grooves is less than that of other positions of the base substrate.

In the array substrate provided by the application, the grooves are corresponding to the second blind holes and are arranged along the second blind holes.

The beneficial effect of the present application is that, compared with the existing display device with the under-screen camera, the array substrate and the display device provided in the present application dispose the second blind holes on the wiring area around the first blind hole. Each second blind hole is located between adjacent signal lines on the wiring area, and will not affect the arrangement of the signal lines. By filling the second blind holes with the transparent material, the light transmittance of the wiring area is increased, the opaque area of the camera area is reduced, and the screen proportion is increased.

BRIEF DESCRIPTION OF THE DRAWINGS

For more clearly illustrating the technical scheme in the embodiment of the present application or the prior art, the following text will briefly introduce the accompanying drawings used in the embodiment or the prior art. It is obvious that the accompanying drawings in the following description are only some embodiments of the present application. For the technical personnel of the field, other drawings can also be obtained from these drawings without paying creative work.

DETAILED DESCRIPTION OF THE PREFERRED EMBODIMENTS

The following embodiments are illustrated with reference to the accompanying drawings to illustrate specific embodiments of the present invention that can be implemented. Directional terms mentioned in the present invention, such as "top", "bottom", "front", "back", "left", "right", "inside", "outside", "side" etc., are only used with reference to the orientation of the accompanying drawings. Therefore, the used directional terms are intended to illustrate, but not to limit, the present invention. In the figures, units with similar structures are represented by the same label.

In view of the technical problem that the existing display device with the under-screen camera occupies a large space in the camera area and affects the screen proportion, one embodiment of the present application can solve this defect.

Figure 1:
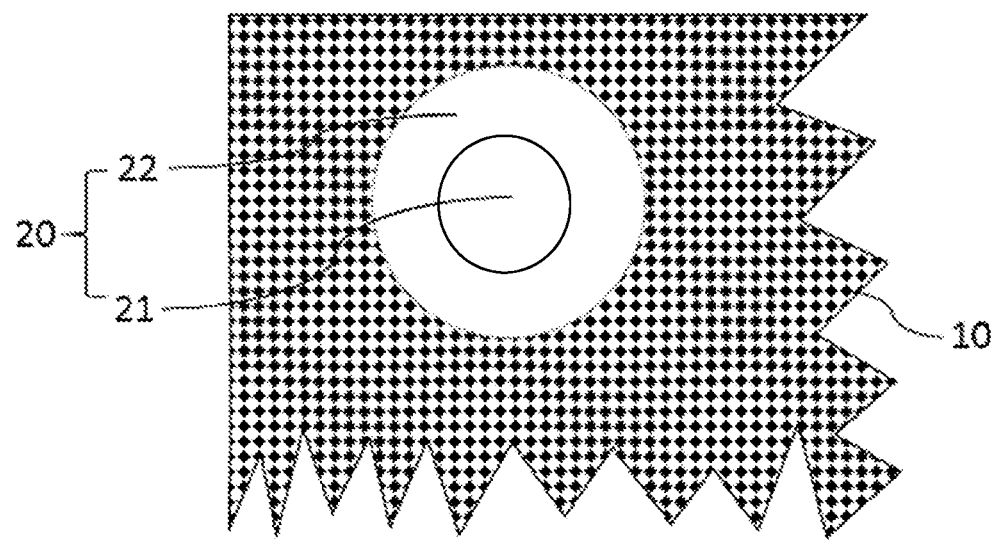
FIG. 1 is a partial overhead view of an array substrate provided by one embodiment of the present application.

Referring to FIG. 1, which is a partial overhead view of an array substrate provided by one embodiment of the present application. The array substrate disposes a camera area 20 in a display area 10. That is, the display area 10 is arranged around the camera area 20. The camera area 20 includes a first blind hole 21 and a wiring area 22 around the first blind hole 21. The first blind hole 21 is used to expose a camera (not shown) disposed on the back of the array substrate. The wiring area 22 disposes signal lines and second blind holes. Wherein, the second blind holes are arranged to avoid the signal lines. The second blind holes adopt the design of hollowing or filling a transparent material, thereby increasing the light transmittance of the wiring area 22, reducing an opaque area of the camera area 20, and further increasing the screen proportion.

Figure 2:
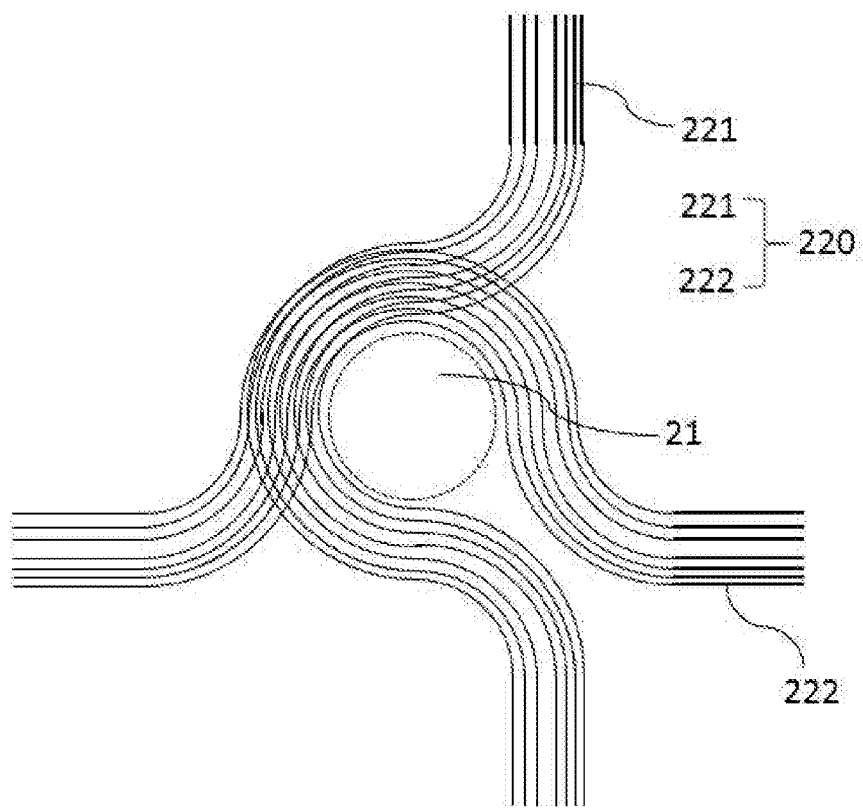
FIG. 2 is a signal line diagram of a wiring area of the array substrate provided by one embodiment of the present application.

Please refer to FIG. 2, which is a signal line diagram of the wiring area of the array substrate provided by one embodiment of the present application. As shown in the figure, because the camera area 20 is provided with the first blind hole 21 that can expose the camera, the signal lines 220 on the array substrate need to bypass the first blind hole 21. Thus, the wiring area 22 for wiring is formed on the periphery of the first blind hole 21. In the figure, the signal lines 220 includes a first signal line 221 bypassing the first blind hole 21 and extending along a first direction, and a second signal line 222 bypassing the first blind hole 21 and extending along a second direction. Wherein, the first signal line 221 and the second signal line 222 are mutually insulated.

In one embodiment, the first signal line 221 includes, but is not limited to a date line. The second signal line 222 includes, but is not limited to a scanning line.

Figure 3:
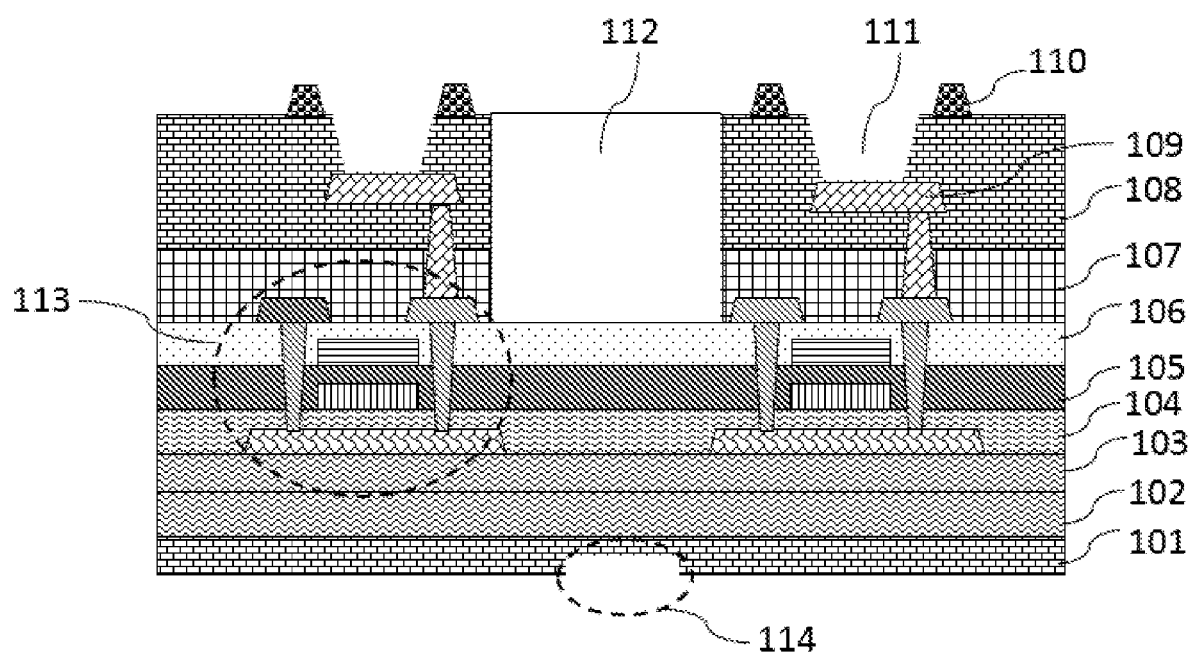
FIG. 3 is a section view of the wiring area of the array substrate provided by one embodiment of the present application.

Referring to FIG. 3, which is a section view of the wiring area of the array substrate provided by one embodiment of the present application. The array substrate includes: a base substrate 101, which includes, but is not limited to, a polyimide film; and further includes: a barrier layer 102, a buffer layer 103, a thin film transistor layer, a planarization layer 107 and a pixel definition layer 108, which are prepared on the base substrate 101 in turn. The pixel definition layer 108 is used to define pixel opening areas 111. The pixel definition layer 108 forms patterned spacer pads 110.

Wherein, the thin film transistor layer includes inorganic film layers arranged in sequence and thin film transistors 113 arranged at intervals in the inorganic film layers. The inorganic film layers includes, but are not limited to, a first gate insulation layer 104, a second gate insulation layer 105 and an intermediate insulation layer 106. The array substrate is provided with patterned anodes 109, which are corresponding to the pixel opening areas 111 and are electrically connected to drains of the corresponding thin film transistors 113.

Please combine FIG. 2 and FIG. 3, the wiring area 22 is provided with the signal lines 110 and the second blind holes 112. The second blind holes 112 are set to avoid the signal lines 220. Each second blind hole 112 is correspondingly disposed between two adjacent pixel opening areas 111 without affecting the normal arrangement of the pixels.

In one embodiment, the second blind holes 112 are respectively located between two adjacent pixel opening areas 111 and are arranged in grid-shaped. Wherein, one grid surrounded by the second blind holes 112 may include one pixel opening area 111, or multiple pixel opening areas 111, without restriction here.

In another embodiment, the second blind holes 112 are arranged at intervals between two adjacent pixel opening areas 111. Wherein, the embodiment does not limit the length and width of the second blind hole 112 as long as the light transmittance of the wiring area 22 can be increased.

Wherein, the second blind hole 112 totally passes through or partially passes through one or more of the pixel definition layer 108, the planarization layer 107 and the thin film transistor layer. That is, the second blind hole 112 may pass through part or whole of the pixel definition layer 108; or the second blind hole 112 passes through the whole pixel definition layer 108 and the partial planarization layer 107; or the second blind hole 112 passes through the whole pixel definition layer 108 and the whole planarization layer 107 to contact with the thin film transistor layer; or the second blind hole 112 passes through one film of the thin film transistor layer or passes through the whole thin film transistor layer from the pixel definition layer 108.

Wherein, the second blind hole 112, the signal line 220 and the thin film transistor 113 are separated by the inorganic film layers and/or organic film layers. That is, the second blind hole 112 does not expose the signal line 220 and the thin film transistor 113, thereby ensuring the performance of water and oxygen isolation at the second blind hole 112.

The inorganic film layers of the thin film transistor layer provided in the embodiment are transparent layers, the transmittance of which can be determined according to the actual process and material selection, so the inorganic film layers does not affect the light transmission. The second blind hole 112 in the figure passes through the pixel definition layer 108 and the planarization layer 107, and is corresponding to a position between two adjacent thin film transistors 113. Light is emitted through the inorganic film layers and through the second blind hole 112, thereby increasing the light transmittance of the wiring area 22 and reducing the opaque area of the camera area 20. In other words, the positions of the prior array substrate corresponding to the first blind hole 21 and the wiring area 22 are opaque, but by using this design, the opaque area of the array substrate is reduced to the position corresponding to the first blind hole 21, thereby increasing the screen proportion.

In one embodiment, the second blind hole 112 is filled with the transparent material for increasing the light transmittance of the wiring area 22. With this design, the second blind hole 112 is filled without affecting the light transmittance, thus facilitating the subsequent preparation of the film.

In the embodiment, the base substrate 101 disposes grooves 114 corresponding to the wiring area 22 on the back of the base substrate 101 away from the pixel definition layer 108. The thickness of the base substrate 101 corresponding to the grooves 114 is less than that of other positions of the base substrate 101. Namely, the thickness of the base substrate 101 corresponding to the wiring area 22 is thinned to further increase the light transmittance. Wherein, the depth of the groove 114 may be set according to actual demand.

In one embodiment, the grooves 114 are corresponding to the second blind holes 112 and are arranged along the second blind holes 112. That is, the distribution of the grooves 114 on the base substrate 101 is consistent with that of the second blind holes 112.

In this embodiment, the first blind hole 21 is not specifically defined. The first blind hole 21 can be a through hole, i.e., through the whole array substrate, or only through multiple films on the array substrate. As long as the photographic performance of the camera is not affected, there is no restriction here. Moreover, the back of the base substrate 101 can also be thinned at the position corresponding to the first blind hole 21, which is not described here.

The present application further provides a display device including above array substrate. Please refer to FIGS. 1 to 3, the display device further includes: an organic light emitting layer being disposed on the array substrate and corresponding to the pixel opening area 111, a cathode layer being disposed on the organic light emitting layer, a film packaging layer prepared on the cathode layer, and a camera component being disposed on a back of the array substrate away from the organic light emitting layer and corresponding to the camera area 20. The camera component includes a camera. Wherein, the first blind hole 21 of the camera area 20 is used to expose the camera; and the second blind holes 112 of the wiring area 22 are filled with the transparent material for increasing the light transmittance of the wiring area 22.

In one embodiment, the film packaging layer at least includes a first inorganic packaging layer, an organic packaging layer and a second inorganic packaging layer, which are arranged in layers. The second blind holes are filled with the first inorganic packaging. This design can simplify the process by directly filling the second blind holes with the film packaging layer without the preparation process of transparent materials.

As described above, the present application provides the array substrate and the display device, which dispose the second blind holes on the wiring area around the first blind hole. Each second blind hole is located between adjacent signal lines on the wiring area, and will not affect the arrangement of the signal lines. By filling the second blind holes with the transparent material, the light transmittance of the wiring area is increased, the opaque area of the camera area is reduced, and the screen proportion is increased.

In summary, although the application has been disclosed as above in the preferred embodiments, the preferred embodiments mentioned above are not intended to limit the application. General technical personnel in the field may make various changes and embellishments without departing from the spirit and scope of the application. Therefore, the scope of protection of the application is subject to the scope defined by the claims.

What is claimed is:

1. An array substrate, comprising a base substrate, a thin film transistor layer, a planarization layer, and a pixel definition layer prepared on the base substrate in turn, the pixel definition layer being used to define pixel opening areas;

the base substrate disposing a camera area in a display area, and the camera area including a first blind hole and a wiring area around the first blind hole;

the first blind hole being used to expose a camera disposed on a back of the base substrate, and the wiring area disposing signal lines and second blind holes;

wherein, the second blind holes are arranged to avoid the signal lines for increasing a light transmittance of the wiring area.

2. The array substrate as claimed in claim 1, wherein each of the second blind holes is correspondingly defined between two adjacent pixel opening areas, and the second blind holes are arranged in grid-shaped or arranged at intervals.

3. The array substrate as claimed in claim 1, wherein each of the second blind holes passes through or partially passes through one or more of the pixel definition layer, the planarization layer, and the thin film transistor layer.

4. The array substrate as claimed in claim 3, wherein the thin film transistor layer includes inorganic film layers arranged in layers and thin film transistors arranged at intervals; and each of the second blind holes corresponds to a position between two adjacent thin film transistors.

5. The array substrate as claimed in claim 4, wherein the second blind holes, the signal lines, and the thin film transistors are separated by the inorganic film layers.

6. The array substrate as claimed in claim 1, wherein the base substrate defines grooves corresponding to the wiring area on the back of the base substrate away from the pixel definition layer; and a thickness of the base substrate corresponding to the grooves is less than that of other positions of the base substrate.

7. The array substrate as claimed in claim 6, wherein the grooves correspond to the second blind holes and are arranged along the second blind holes.

8. A display device comprising the array substrate as claimed in claim 1, wherein the display device further comprises:
an organic light emitting layer disposed on the array substrate and corresponding to the pixel opening areas;
a film packaging layer disposed on the organic light emitting layer; and
the camera disposed on a back of the array substrate away from the organic light emitting layer and corresponding to the camera area;
wherein the first blind hole of the camera area is used to expose the camera, and the second blind holes of the wiring area are filled with transparent material for increasing the light transmittance of the wiring area.

9. The display device as claimed in claim 8, wherein the film packaging layer at least includes a first inorganic packaging layer, an organic packaging layer, and a second inorganic packaging layer arranged in layers, and the second blind holes are filled with the first inorganic packaging layer.

10. An array substrate, comprising a base substrate, a thin film transistor layer, a planarization layer, and a pixel definition layer prepared on the base substrate in turn, the pixel definition layer being used to define pixel opening areas;
the base substrate disposing a camera area in a display area, and the camera area including a first blind hole and a wiring area around the first blind hole;
the first blind hole being used to expose a camera disposed on a back of the base substrate, and the wiring area disposing signal lines and second blind holes;
wherein, the second blind holes are arranged to avoid the signal lines and are filled with transparent material for increasing a light transmittance of the wiring area.

11. The array substrate as claimed in claim 10, wherein each of the second blind holes is correspondingly defined between two adjacent pixel opening areas, and the second blind holes are arranged in grid-shaped or arranged at intervals.

12. The array substrate as claimed in claim 10, wherein each of the second blind holes passes through or partially passes through one or more of the pixel definition layer, the planarization layer, and the thin film transistor layer.

13. The array substrate as claimed in claim 12, wherein the thin film transistor layer includes inorganic film layers arranged in layers and thin film transistors arranged at intervals; and each of the second blind holes corresponds to a position between two adjacent thin film transistors.

14. The array substrate as claimed in claim 13, wherein the second blind holes, the signal lines, and the thin film transistors are separated by the inorganic film layers.

15. The array substrate as claimed in claim 10, wherein the base substrate defines grooves corresponding to the wiring area on the back of the base substrate away from the pixel definition layer; and a thickness of the base substrate corresponding to the grooves is less than that of other positions of the base substrate.

16. The array substrate as claimed in claim 15, wherein the grooves correspond to the second blind holes and are arranged along the second blind holes.

* * * * *